United States Patent [19]
Oka et al.

[11] Patent Number: 6,140,690
[45] Date of Patent: Oct. 31, 2000

[54] SEMICONDUCTOR DEVICE

[75] Inventors: Itsuzo Oka, Kyoto; Katsuhiko Higashiyama; Taizo Oohama, both of Osaka, all of Japan

[73] Assignee: Matsushita Electric Industrial Co., Ltd., Osaka, Japan

[21] Appl. No.: 08/972,060

[22] Filed: Nov. 17, 1997

[30] Foreign Application Priority Data

Nov. 18, 1996 [JP] Japan .................................. 8-306483

[51] Int. Cl.⁷ ................................................. H01L 29/732
[52] U.S. Cl. .......................... 257/494; 257/495; 257/500
[58] Field of Search .................................... 257/494, 495, 257/504, 500

[56] References Cited

U.S. PATENT DOCUMENTS 5,162,252  11/1992  Kanda et al. ............................ 257/554

*Primary Examiner*—David Hardy
*Attorney, Agent, or Firm*—McDermott, Will & Emery

[57] ABSTRACT

Two bipolar transistors formed on a common semiconductor substrate are separated by a separation band. The separation band includes a first separation portion having the same conductivity type, and substantially the same impurity concentration and diffusion depth as those of each of base regions of the bipolar transistors, and second separation portions, formed on both sides of the first separation portion, which have the same conductivity type and substantially the same impurity concentration and diffusion depth as those of each of emitter regions. The second separation portions are formed so as to be shallower than the first separation portion. The second separation portions are formed across the first separation portion in a deeper portion of the substrate and a collector region. The second separation portions enclose the respective transistors, and the first separation portion separates the transistors from each other. Accordingly, a semiconductor device in which a plurality of semiconductor devices having substantially identical output characteristics and thermal characteristics are provided on a common semiconductor device and a signal of one semiconductor device is not affected by a signal of the other semiconductor device is provided.

17 Claims, 11 Drawing Sheets

SEMICONDUCTOR DEVICE

BACKGROUND OF THE INVENTION

The invention relates to a semiconductor device provided with a plurality of transistors including a power transistor. Particularly, the invention relates to prevention countermeasures for characteristic deterioration caused by interference between respective transistors.

FIG. 8 is a circuit diagram showing an example of a loudspeaker output circuit (a hybrid integrated circuit) for a general type of audio equipment. The loudspeaker output circuit includes, as shown in FIG. 8, a pair of complementary transistors. The transistors are connected to a pair of loudspeakers in series. Specifically, a circuit including an NPN transistor 32A and a PNP transistor 33A is connected to a loudspeaker 31A. A circuit including an NPN transistor 32B and a PNP transistor 33B is connected to a loudspeaker 31B.

In such a loudspeaker output circuit, the output characteristics of the pair of loudspeakers are required to be identical. Generally, in a case where a plurality of circuits have respective power transistors, the plurality of power transistors are individually connected to and mounted on a substrate. If a plurality of power transistors are mounted onto a common substrate, deterioration in thermal characteristics and high voltage durability of the respective transistors which constitute the circuits may disadvantageously be caused by influences of current leakage between the respective transistors and heat generation. Accordingly, in a case where a plurality of circuits having identical output characteristics are required as in the example, transistors the number of which is equal to the number of the circuits which are required to have identical output characteristics are selected from among transistors which are individually produced. An NPN transistor and a PNP transistor having matched characteristics are connected in series. Thus, the plurality of circuits having identical characteristics are conventionally realized.

As disclosed in Japanese Laid-Open Patent Publication No. 6-342876, as a semiconductor device provided with a function for protecting an output transistor formed on a semiconductor substrate from a thermal breakdown, a semiconductor device in which a transistor for detecting a temperature of the output transistor is disposed in an area enclosed by the output transistor is proposed. In the semiconductor device, the output transistor and the transistor for detecting a temperature through which a weak signal flows are electrically separated by a single impurity diffusion region (a channel stopper) formed simultaneously with an emitter region of the transistor.

In recent years, high power and multi channel are required for an audio output amplifier. In a case where the above-described conventional loudspeaker circuit is used, transistors which are individually produced are used for constituting respective circuits. Therefore, it is necessary to match the electrical characteristics or characteristics such as thermal characteristics in the respective transistors in order to realize identical output characteristics of the plurality of circuits.

However, it is difficult to match the characteristics of transistors which are individually produced in accordance with the purposes, as described in the conventional technique. This causes an increase in the production cost. It is also difficult to obtain a plurality of circuits having sufficiently identical characteristics.

Moreover, there exists a problem in that transistors are individually connected in a circuit used for audio loudspeaker output, so that the size of the hybrid integrated circuit is increased.

In the semiconductor device including the output transistor having the thermal breakdown protecting function disclosed in the above-identified publication, insufficient thermal separation of the output transistor from the transistor for detecting a temperature which are separated by the channel stopper causes a problem in that the operation of one transistor is easily affected by another transistor. Especially, the operation of the transistor for detecting a temperature is easily affected by the output transistor and noise from the outside of the semiconductor device.

SUMMARY OF THE INVENTION

A first object of the invention is to provide, by providing means for surely performing electric separation of a semiconductor device from other regions, a semiconductor device in which a plurality of power semiconductor devices individually controlled but having substantially identical output characteristics are disposed on a common substrate, or to provide a semiconductor device in which a detecting device or a signal control device dealing with a weak signal and a power semiconductor device dealing with a high voltage and a large current are disposed on a common semiconductor substrate.

A second object of the invention is to realize uniform thermal characteristics of respective transistors in a semiconductor device in which a plurality of power semiconductor devices are mounted.

In order to attain the above-mentioned first object, the invention proposes the following first semiconductor device.

The first semiconductor device of the invention is a semiconductor device comprising a semiconductor substrate, two semiconductor devices formed in part of the semiconductor substrate, and a separation band for electrically separating the two semiconductor devices, wherein the separation band comprises: a first semiconductor region of a first conductivity type; and a second semiconductor region of a second conductivity type formed adjacently to the first semiconductor region, the second semiconductor region being shallower than the first semiconductor region.

Accordingly, unlike a conventional semiconductor device having a separation construction of a single conductivity type, a separation construction of, so to speak, double conductivity type can be obtained. Thus, good electric separation between two semiconductor devices can be realized, and it is possible to realize device separation so that the respective semiconductor devices can independently operate.

It is preferred that the second semiconductor region of the separation band is formed in a position close to the semiconductor devices.

It is preferred that the second semiconductor region of the separation band is formed continuously from one side face to the other side face of the semiconductor substrate at least in a region in the vicinity of an upper face of the semiconductor substrate.

Accordingly, a leakage via a side face of the semiconductor substrate is reduced, so that the separation property between the respective semiconductor devices and the high voltage durability of the respective semiconductor devices are improved.

It is preferred that the second semiconductor region of the separation band sandwiches the first semiconductor region on both sides of the first semiconductor region.

Accordingly, a double conductivity-type construction can be obtained in respective portions of the separation band, and the separation function is increased.

It is preferred that the first semiconductor region of the separation band reaches an upper face of the semiconductor substrate.

Accordingly, a leakage via an upper face of the semiconductor substrate Is reduced, so that the separation property between the respective semiconductor devices and the high voltage durability of the respective semiconductor devices are increased.

It is preferred that the second semiconductor region of the separation band is formed across the first semiconductor region and each of the semiconductor devices in a deeper portion of the semiconductor substrate.

Accordingly, an area occupied by the separation band is reduced, so that an occupied area of the whole semiconductor device can be reduced, and the production cost can also be lowered.

It is preferred that in the case where each of the semiconductor devices is a vertical-type device, one of the first semiconductor region and the second semiconductor region of the separation band has substantially the same diffusion depth as that of a diffusion region of the vertical-type device.

Accordingly, the first or the second semiconductor region of the separation band can be formed by utilizing the impurity introducing process for forming the semiconductor device, so that the production cost can be lowered.

It is preferred that, in the case where each of the semiconductor devices is a power vertical-type bipolar transistor including: an emitter region of the second conductivity type formed on the side of an upper face of the semiconductor substrate; a base region of the first conductivity type formed by enclosing the emitter region in the semiconductor substrate; and a collector region of the second type formed by enclosing the base region in the semiconductor substrate, the first semiconductor region of the separation band has a diffusion depth and an impurity concentration which are equal to or more than those of the base region.

Accordingly, the first semiconductor region of the separation band can be formed by utilizing the impurity introducing process for forming the base region of the power vertical-type bipolar transistor, so that the production cost can be lowered.

It is preferred that, in the case where each of the semiconductor devices is a power vertical-type bipolar transistor including: an emitter region of the second conductivity type formed on the side of an upper face of the semiconductor substrate; a base region of the first conductivity type formed by enclosing the emitter region in the semiconductor substrate; and a collector region of the second conductivity type formed by enclosing the base region in the semiconductor substrate, the second semiconductor region of the separation band has an impurity concentration and a diffusion depth which are substantially equal to those of the emitter region.

Accordingly, the second semiconductor region of the separation band can be formed by utilizing the impurity introducing process for forming the emitter region of the power vertical-type bipolar transistor, so that the production cost can be lowered.

It is preferred that, in the case where each of the semiconductor devices is a vertical-type bipolar transistor including: an emitter region of the second conductivity type formed on the side of an upper face of the semiconductor substrate; a base region of the first conductivity type formed by enclosing the emitter region in the semiconductor substrate; and a collector region of the second conductivity type formed by enclosing the base region in the semiconductor substrate, horizontal distances between each of the second semiconductor regions of the separation band and each of base regions of each semiconductor device which is opposite to the each of the second semiconductor regions by sandwiching the collector region of the each of the semiconductor device on both sides of the separation band are substantially equal to each other.

Accordingly, the separation property and the high voltage durability of the power vertical-type bipolar transistors can be substantially equalized.

It is preferred that, in the case where each of the semiconductor devices is a vertical-type bipolar transistor including: an emitter region of the second conductivity type formed on the side of an upper face of the semiconductor substrate; a base region of the first conductivity type formed by enclosing the emitter region in the semiconductor substrate; and a collector region of the second conductivity type formed by enclosing the base region in the semiconductor substrate, one of two second semiconductor regions of the separation band encloses one of the two semiconductor devices, and a horizontal distance between the one of the second semiconductor regions and a base region of the one of the semiconductor devices is substantially constant over an entire circumference of the one of the semiconductor devices.

Accordingly, it is possible to realize a construction in which each of the power vertical-type bipolar transistors is broken down at a withstand voltage value of the transistor, so that the separation property and high voltage durability of the respective semiconductor devices are increased.

It is preferred that, in the case where each of the semiconductor devices is a power MOSFET including: a source region of the second conductivity type formed on the side of an upper face of the semiconductor substrate; a well region of the first conductivity type formed adjacently to the source region on the side of the upper face of the semiconductor substrate; a substrate region of the second conductivity type formed by enclosing the well region in the substrate, the substrate region reaching a lower face of the semiconductor substrate; a channel region of the first conductivity type interposed between the source region and the substrate region in the vicinity of the upper face of the semiconductor substrate; and a gate disposed over the source region, the channel region and the substrate region via an insulating film, the first semiconductor region of the separation band has a diffusion depth and an impurity concentration which are equal to or more than those of the well region.

Accordingly, the first semiconductor region of the separation band can be formed by utilizing the impurity introducing process for forming the well region of the power vertical-type MOSFET, so that the production cost can be lowered.

It is preferred that, in the case where each of the semiconductor devices is a power MOSFET including: a source region of the second conductivity type formed on the side of an upper face of the semiconductor substrate; a well region of the first conductivity type formed adjacently to the source region on the side of the upper face of the semiconductor substrate; a substrate region of the second conductivity type formed by enclosing the well region in the substrate, the substrate region reaching a lower face of the semiconductor substrate; a channel region of the first conductivity type interposed between the source region and the substrate region in the vicinity of the upper face of the semiconductor substrate; and a gate disposed over the source region, the channel region and the substrate region via an insulating film, the second semiconductor region of the separation band has an impurity concentration and a diffusion depth which are substantially equal to those of the source region.

Accordingly, the second semiconductor region of the separation band can be formed by utilizing the impurity introducing process for forming the source region of the power vertical-type MOSFET, so that the production cost can be lowered.

It is preferred that the first semiconductor region of the separation band separates the two second semiconductor regions between the semiconductor devices in an area in the vicinity of an upper face of the semiconductor substrate.

Accordingly, a leakage is difficult to occur via two second semiconductor regions occurs, so that the separation function of the separation band is increased.

It is preferred that each of the second semiconductor regions of the separation band encloses a corresponding one of the semiconductor devices at least in the vicinity of the upper face of the semiconductor substrate.

Accordingly, a function as a channel stopper of the semiconductor device can be obtained.

One of the two semiconductor devices can be a power transistor, and the other one of the two semiconductor devices can be selected from a sensor device and a control device attached to the power transistor.

Accordingly, the separation band having a high separation function is provided so that it is possible to surely cut off the influence by an external noise to a sensor device or a control device dealing with a weak signal or a signal of the power transistor.

It is preferred that the other one of the semiconductor devices is a vertical-type device, and at least one semiconductor region of the first semiconductor region and the second semiconductor regions of the separation band has a diffusion depth which is substantially equal to that of a diffusion region of the other one of the semiconductor devices.

Accordingly, the first or second semiconductor region can be formed by utilizing the process for forming the diffusion region of the sensor device or the control device, so that the production cost of the semiconductor device can be lowered.

It is preferred that the one of the semiconductor devices is a vertical-type device, and at least one semiconductor region of the first semiconductor regions and the second semiconductor regions has a diffusion depth which is substantially equal to that of a diffusion region of the one of the semiconductor devices.

Accordingly, the first or second semiconductor region can be formed by utilizing the process for forming the diffusion region of the power transistor, so that the production cost of the semiconductor device can be lowered.

It is preferred that, in the case where each of the semiconductor devices is a vertical-type bipolar transistor including: an emitter region of the second conductivity type formed on the side of the upper face of the semiconductor substrate; a base region of the first conductivity type formed by enclosing the emitter region in the semiconductor substrate; and a collector region of the second conductivity type formed by enclosing the base region in the semiconductor substrate, the other one of the semiconductor devices is a temperature detecting device, the emitter region of the bipolar transistor is disposed around the other one of the semiconductor devices, and the collector regions of the semiconductor devices are provided in common under the separation band.

Accordingly, the temperature detecting device is surrounded by the heat generating portion of the vertical-type bipolar transistor, so that a temperature of the vertical-type bipolar transistor becomes substantially equal to a temperature of the temperature detecting device. Thus, the accuracy of the detected temperature by the temperature detecting device is increased.

It is preferred that the separation band encloses a circumference of the other one of the semiconductor devices.

Accordingly, the invasion of an external signal to the temperature detecting device can be surely prevented.

In order to attain the above-mentioned second object, the invention proposes the following second to fourth semiconductor devices.

The second semiconductor device of the invention is a semiconductor device comprising: a semiconductor substrate having a chip shape; two power semiconductor devices provided in the semiconductor substrate, the power semiconductor devices having substantially identical electric characteristics, and part of each of the power semiconductor devices functioning as a heat generating portion; and a separation band for electrically separating the semiconductor devices, wherein the heat generating portions of the two semiconductor devices are disposed in opposite corners of the chip shape.

Accordingly, the separation property Is increased, and the heat generating portions of the power semiconductor devices are disposed distantly as much as possible from each other, so that it is possible to prevent the heat from staying in the center of the semiconductor substrate. Thus, a good heat radiation characteristic can be obtained.

It is preferred that, in the case where each of the semiconductor devices is a power vertical-type bipolar transistor, the bipolar transistors include a common collector region, and base regions and emitter regions are separated by the separation band.

Accordingly, the power semiconductor devices have a common collector region, so that the thermal characteristics of the power semiconductor devices can be equalized.

The third semiconductor device of the invention is a semiconductor device comprising: a semiconductor substrate having a chip shape; four power semiconductor devices provided in four regions including at least one corner of the semiconductor substrate, the power semiconductor devices having substantially identical electric characteristics, and part of each of the power semiconductor devices functioning as a heat generating portion; and a separation band for electrically separating the four semiconductor devices, wherein the heat generating portions of the semiconductor devices are disposed in the corners, respectively.

It is preferred that, in the case where each of the semiconductor devices is a power vertical-type bipolar transistor, the bipolar transistors include a common collector region, and base regions and emitter regions are separated by the separation band.

The fourth semiconductor device of the invention is a semiconductor device comprising: a semiconductor substrate having a chip shape; two power semiconductor devices provided in the semiconductor substrate, the power semiconductor devices having substantially identical electric characteristics, and part of each of the power semiconductor devices functioning as a heat generating portion; and a separation band for electrically separating the two semiconductor devices, wherein part of the heat generating portion of each of the semiconductor devices is close to the separation band, and another part of the heat generating portion is farther from the separation band, and relative positions of the two heat generating portions are determined so that a portion of the separation band which is close to the two heat generating portions is minimum.

Accordingly, the separation property is increased, and portions affected by the heat generating portions are reduced. Thus, the heat radiation characteristics of the power semiconductor devices are increased.

In the case where each of the semiconductor devices is a power vertical-type bipolar transistor, it is possible that a base region of the bipolar transistor is formed along a shape in which the semiconductor substrate is divided by the separation band, an emitter region of the bipolar transistor is formed in the base region, and the heat generating portion is determined by a shape of the emitter region of the bipolar transistor.

It is preferred that circumferential portions of the base regions of the respective semiconductor devices are symmetric with respect to the separation band as a line in plan, and the emitter regions of the respective semiconductor devices are symmetric with respect to a center portion of the separation band as a point in plan.

Accordingly, the heat radiation characteristics of the power semiconductor devices can be substantially equalized.

DETAILED DESCRIPTION OF THE INVENTION

Hereinafter, preferred embodiments of the invention will be described in detail with reference to the drawings.
(First Embodiment)

Figure 1:
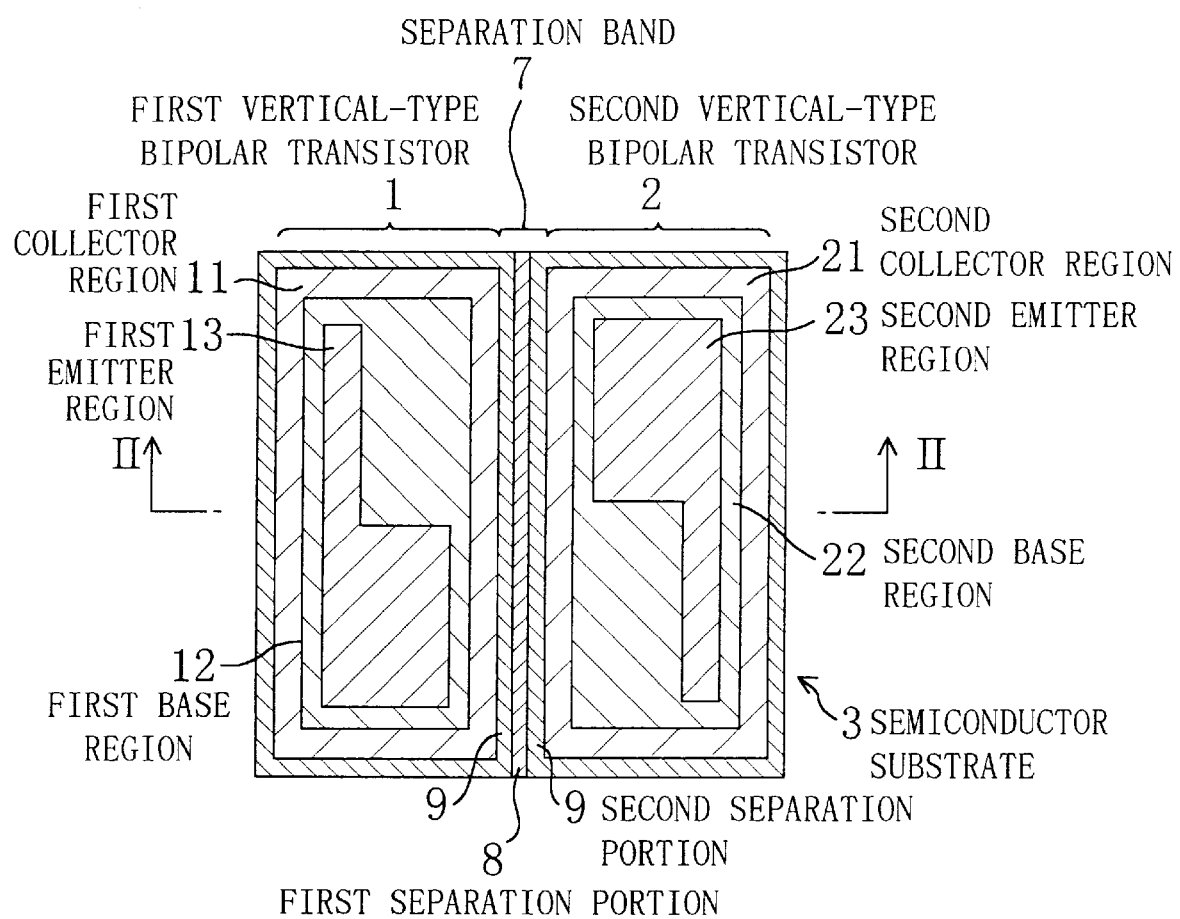
FIG. 1 is a plan view of a semiconductor device according to a first embodiment in which two vertical-type bipolar transistors are disposed.
Figure 2:
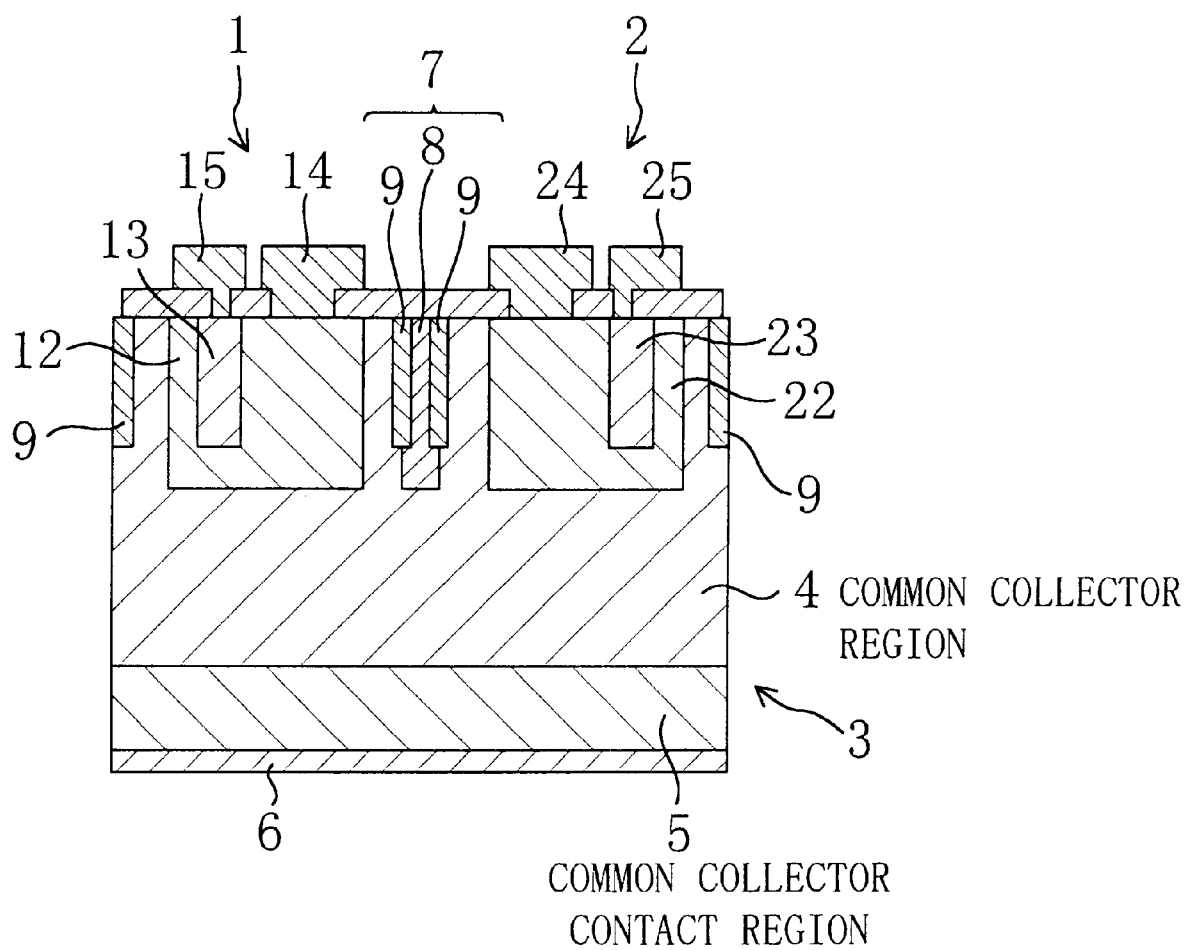
FIG. 2 is a cross-sectional view taken along a line II—II shown in FIG. 1.

FIG. 1 is a plan view of a semiconductor device according to a first embodiment of the invention. FIG. 2 is a cross-sectional view taken along a line II—II shown in FIG. 1. In FIG. 2, a plurality of electrodes and an insulating film in an upper portion of the semiconductor device shown in FIG. 1 are omitted.

This embodiment describes a case where a pair of two vertical-type transistors having a common collector region are formed on a common semiconductor substrate.

As shown in FIG. 1, the semiconductor device has the following construction in plan.

On a semiconductor substrate 3, two NPN vertical-type bipolar transistors (a first vertical-type bipolar transistor 1 and a second vertical-type bipolar transistor 2) which are separated by a separation band 7 are disposed. The semiconductor substrate 3 has, for example, a chip size of 3.3 mm×3.3 mm and a thickness of 200 µm. The semiconductor substrate 3 is doped with an N-type impurity (for example, boron) so as to have a concentration of about $5 \times 10^{14}/mm^3$.

The first vertical-type bipolar transistor 1 includes an N-type first emitter region 13, a P-type first base region 12 enclosing the first emitter region 13, and an N-type first collector region 11 enclosing the first base region 12. The second vertical-type bipolar transistor 2 also includes an N-type second emitter region 23, a P-type second base region 22 enclosing the second emitter region 23, and an N-type second collector region 21 enclosing the second base region 22. Each of the first and second emitter regions 13 and 23 of the vertical-type bipolar transistors 1 and 2 has a closer portion to the separation band 7 and a farther portion from the separation band 7. The vertical-type bipolar transistors 1 and 2 are disposed in such a manner that the respective closer portions to the separation band 7 overlap as little as possible. In other words, each of the emitter regions 13 and 23 has such a shape in plan that a part of a rectangle is chipped. The emitter regions 13 and 23 are disposed so as to be symmetric with respect to a center point of the semiconductor device. Each of the first and second base regions 12 and 22 of the vertical-type bipolar transistors 1 and 2 has a rectangular appearance in plan. The first and second base regions 12 and 22 are disposed so that the respective circumference portions are symmetric with respect to a center line of the semiconductor device. Each of the first and second base regions 12 and 22 is, for example, about 3.1 mm long and 1.45 mm wide in plan.

The separation band 7 includes a first separation portion 8 and a second separation portion 9. The first separation portion 8 has the same conductivity type and substantially the same impurity concentration and diffusion depth as those of the base regions 12 and 22, and has a width of about 30 µm in the vicinity of an upper face. The second separation portion 9 is formed on both sides of the first separation portion 8. The second separation portion 9 has the same conductivity type and substantially the same impurity concentration and diffusion depth as those of the emitter regions 13 and 23. The first separation portion 8 is formed linearly from one side face to the other side face which is opposite to the one side face so that the first separation portion 8 crosses the semiconductor substrate 3 in the upper face of the semiconductor substrate 3. In other words, the first separation portion 8 is formed so as to divide the semiconductor substrate 3 into two portions in plan. In the upper face of the semiconductor substrate 3, the second separation portions 9 are formed so as to sandwich the first separation portion 8 in a center portion of the semiconductor substrate 3, and so as to enclose the circumferences of the respective bipolar transistors 1 and 2. In other words, the second separation portions 9 are formed so as to enclose the first and second collector regions 11 and 21. The second separation portions 9 have a width of about 30 μm in any portion.

As shown in FIG. 2, the semiconductor device has the following construction in a section taken along a line II—II shown in FIG. 1.

On a lower face of the semiconductor substrate 3, a collector electrode 6 is formed. A lowest portion of the semiconductor substrate 3 which is close to the collector electrode 6 is a common collector contact region 5 of an N+-type. An N--type common collector region 4 exists on the common collector contact region 5. On the common collector region 4, the separation band 7, and the first and second base regions 12 and 22 and the first and second emitter regions 13 and 23 of the respective vertical-type bipolar transistors 1 and 2 are formed. The common collector region 4 functions as the first collector region 11 in the vicinity of the first base region 12, and functions as the second collector region 21 in the vicinity of the second base region 22. There is no boundary between the first collector region 11 and the second collector region 21. The first and second base regions 12 and 22 are enclosed by the first and second collector regions 11 and 21, respectively, in the substrate. The first and second emitter regions 13 and 23 are enclosed by the first and second base regions 12 and 22, respectively. In other words, the emitter regions 13 and 23 are shallower than the base regions 12 and 22, respectively. The first and second base regions 12 and 22 have the same depth, and the first and second emitter regions 13 and 23 have the same depth.

On the upper face of the semiconductor substrate 3, a first base electrode 14 and a second base electrode 24, and a first emitter electrode 15 and a second emitter electrode 25 are formed. The first and second base electrodes 14 and 24 are in contact with the first and second base regions 11 and 12. The first and second emitter electrodes 15 and 25 are in contact with the first and second emitter regions 13 and 23. An insulating film is interposed between the substrate and each of the electrodes other than the contact portions in which the respective electrodes are in contact with the respective regions.

In the semiconductor substrate 3, the first separation portion 8 of the separation band 7 is formed so as to have the same depth as that of the first and second base regions 12 and 22. The second separation portions 9 are formed so as to have the same depth as that of the first and second emitter regions 13 and 23. As a result, the first separation portion 8 is deeper than the second separation portions 9. A deeper portion of the first separation portion 8 in the semiconductor substrate 3 has a width of about 60 μm (as described above, the width in the vicinity of the upper face is 30 μm). Specifically, in a deeper portion of the semiconductor substrate 3, only the first separation portion 8 exists. In the vicinity of the upper face of the semiconductor substrate 3, the second separation portions 9 are formed in boundary portions between the first separation portion 8 and the first and second collector regions 11 and 21. Thus, the first separation portion 8 is sandwiched by the two second separation portions 9.

Next, a method for producing the semiconductor device according to this embodiment will be described.

First, boron is simultaneously diffused in a selective manner onto a circular N-type silicon substrate 3 having a diameter of 10 cm (4 inches) which is doped with phosphorus. Thus, a first base region 12, a second base region 22, and a first separation portion 8 which are independent are simultaneously formed so as to have the same diffusion depth. A common collector region 4 has the same impurity concentration as that of the N-type silicon substrate 3 which is doped with phosphorus. Generally, the phosphorus of higher concentration is doped in the common collector contact region 5 than that of the common collector region 4.

Next, phosphorus is introduced into part of the first and second base regions 12 and 22 which are formed in the foregoing process, so as to form a first emitter region 13 and a second emitter region 23. At the same time, phosphorus is also introduced into a region spreading across the first base region 12 and the first separation portion 8 and a region spreading across the second base region 22 and the first separation portion 8, so as to form second separation portions 9. As the result of this process, the emitter regions 13 and 23 and the second separation portions 9 which are shallower than the base regions 12 and 22 are formed.

Thereafter, after an insulating film is deposited on the substrate, a connection hole is formed through the insulating film. A metal film such as an aluminum alloy film is deposited on the substrate. The metal film is processed by patterning, so as to form a first base electrode 14 and a second base electrode 24 which are in contact with the first and second base regions 12 and 22, respectively, and a first emitter electrode 15 and a second emitter electrode 25 which are in contact with the first and second emitter regions 13 and 23, respectively.

In a final process, the circular silicon substrate 3 is cut into semiconductor devices. Each of the semiconductor devices has an appropriate chip size and includes a pair of a first vertical-type bipolar transistor 1 and a second vertical-type bipolar transistor 2, and the separation band 7 for electrically separating the transistors from each other.

The semiconductor device according to this embodiment can attain the following functions and effects by the above-described construction.

Figure 8:
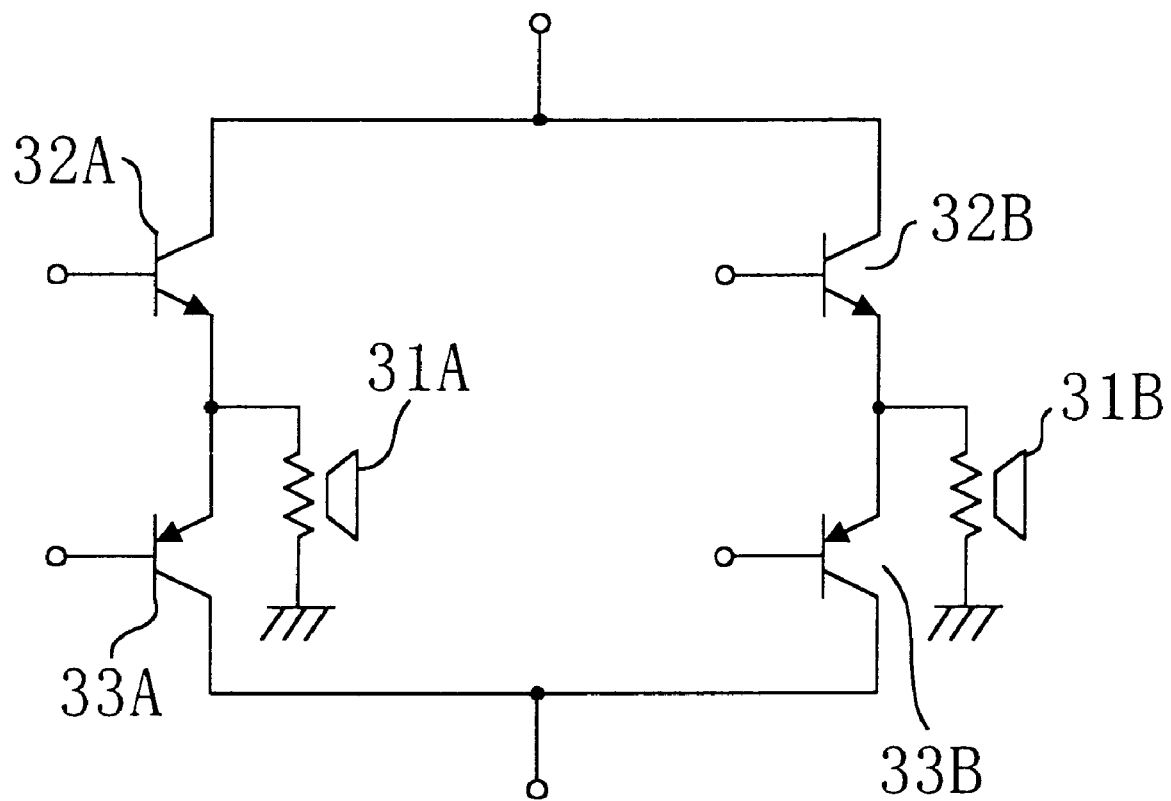
FIG. 8 is a circuit diagram showing an example of a loudspeaker output circuit for audio equipment in which the conventional semiconductor device and the semiconductor device of the first embodiment are disposed.

First, the two vertical-type bipolar transistors 1 and 2 which are required to have identical characteristics are simultaneously formed in a paired manner in close positions on a common semiconductor substrate by one and the same production process. Thus, as compared with two vertical-type bipolar transistors which are individually formed as in the prior art, the electrical characteristics or the thermal characteristics of the respective vertical-type bipolar transistors 1 and 2 are very similar. The vertical-type bipolar transistors 1 and 2 are used for the NPN bipolar transistors 32A and 32B in the circuit shown in FIG. 8, and the paired two PNP vertical-type bipolar transistors formed on the common semiconductor substrate having the same construction as that of this embodiment are used for the PNP bipolar transistors 33A and 33B, so that the characteristics of the loudspeakers 31A and 31B can be matched so as to be substantially identical.

Especially, the separation band 7 is constituted by two layers having different conductivity types, i.e., the separation band 7 has, so to speak, a double conductivity-type construction, so that it is possible to ensure the separation and the withstand voltage property between the paired vertical-type transistors.

Secondly, the first separation portion 8 of the separation band 7 has substantially the same depth, the same conductivity type, and the same impurity concentration as those of the base regions 12 and 22. The second separation portion 9 has substantially the same depth, the same conductivity type, and the same impurity concentration as those of the emitter regions 13 and 23. Accordingly, the separation band 7 can be formed by utilizing the process for forming the vertical-type bipolar transistors 1 and 2.

Thirdly, according to the construction of the separation band 7, breakdown is caused at a voltage which is substantially equal to a withstand voltage value of each of the vertical-type bipolar transistors 1 and 2. Accordingly, the separation withstand voltage value between the respective vertical-type bipolar transistors 1 and 2 can be highly maintained. That is, when a bias is applied across the emitter electrodes 15 and 25 of each of the vertical-type bipolar transistors 1 and 2, similarly to the case where a reverse bias is applied between the base region and the collector region, a depletion layer spreads around the base region. At this time, if the distance between the base region and the surrounding separation band (including the second separation portions) is made to be uniform, the spread of the depletion layer can be substantially uniform around the base region. As a result, a breakdown is caused at a voltage substantially equal to a voltage at which each of the vertical-type bipolar transistors 1 and 2 is broken down by a reverse bias across the base region and the collector region. In other words, the separation withstand voltage value between the respective vertical-type bipolar transistors 1 and 2 is ensured to a level substantially equal to the withstand voltage value of the transistor. For example, the distances from both ends of the separation band 7 to the first base region 12 and the second base region 22 are 60 μm. The base depth (diffusion depth) and the emitter depth (diffusion depth) are 15 μm and 12 μm, respectively. In the case where the specific resistance of the common collector region 4 as the N-type silicon substrate is 10 ohms, the separation withstanding voltage of the respective vertical-type bipolar transistors 1 and 2 is 100 volts.

Fourthly, the collector regions 11 and 21 of the respective vertical-type bipolar transistors 1 and 2 are formed continuously to the common collector region 4 in the deeper portion of the substrate. In other words, the respective transistors have common collector regions, so that it is possible to share the heat generated in the vertical-type bipolar transistors 1 and 2. As a result, it is easy to match the respective thermal characteristics.

Fifthly, the first separation portion 8 overlaps the second separation portions 9 in the separation band 7, so that it is possible to make the entire width of the separation band 7 narrower. That is, the chip size can be as small as possible, so that it is possible to prevent the production cost of the semiconductor device from increasing.

Sixthly, as shown in FIG. 2, in the separation band 7, the first separation portion 8 having the same conductivity type and the same impurity concentration as those of the base regions 12 and 22 reaches the upper face of the semiconductor substrate 3, and the first separation portion 8 protrudes downwardly as compared with the second separation portion 9 (i.e., the first separation portion 8 is deeper than the second separation portion 9 in the semiconductor substrate 3). Thus, a good separation property can be obtained between the transistors 1 and 2.

In addition, the semiconductor device has the shape shown in FIG. 1 in plan, so that the following functions and effects can be attained.

First, the substrate region in which the vertical-type bipolar transistors 1 and 2 are to be formed is divided into two regions which are symmetric with respect to a line by the separation band 7 formed in the center portion of the semiconductor substrate 3 having a chip shape. The circumferential portions of the first and second base regions 12 and 22 are symmetric with respect to a line. Thus, it is possible to further equalize the electrical characteristics or the thermal characteristics of the respective vertical-type bipolar transistors.

Secondly, as for the first emitter region 13 and the second emitter region 23 which are emitter regions involved in main heat generating portions, portions of the emitter regions 13 and 23 closer to the separation band 7 are made as small as possible. In addition, the emitter regions 13 and 23 are disposed in a symmetric manner with respect to a point. Thus, wide regions of the respective emitter regions 13 and 23 (the main heat generating portions) are disposed in an offset manner, so that the characteristics of the two vertical-type bipolar transistors 1 and 2 which are separated by the separation band 7 can be equal. As a result, the thermal resistance property can be further enhanced.

Thirdly, the appearance of each of the emitter regions 13 and 23 is different from that of each of the base regions 12 and 22, so that the heat generated by the two vertical-type bipolar transistors 1 and 2 does not stay in the center portion of the semiconductor substrate 3, and the thermal characteristic is not deteriorated. Especially in this embodiment, the emitter regions 13 and 23 have a pair of wide corner portions which are opposite in the semiconductor substrate 3, and the first emitter region 13 and the second emitter region 23 are not in contact with the separation band 7. Thus, the effect can be remarkably attained. Actually, in a semiconductor device according to this embodiment having the above-described construction, the thermal resistance was increased by about 20% as compared with a semiconductor device having a conventional construction in which a pair of vertical bipolar transistors are simply formed.

In this embodiment, portions of the emitter regions 13 and 23 which are distant from the separation band 7 are longer than portions of the emitter regions 13 and 23 which are closer to the separation band 7, so that the emitter regions 13 and 23 are not in contact with the separation band 7. In other words, the emitter regions 13 and 23 have such shapes viewed in plan that they are not close to each other. However, the invention is not limited to the plan shapes of this embodiment. Alternatively, a portion of each emitter region which is closer to the separation band is longer than a portion of each emitter region which is distant from the separation band. In such a case, it is sufficient that portions of the separation band which are close to the emitter regions on both sides are minimum.

Fourthly, in this embodiment, the wide regions of the emitter regions 13 and 23 can be used for performing wire bonding or the like to the emitter electrodes 15 and 25, so that the pattern shape is clarified. In addition, the emitter electrodes 15 and 25 are distant from each other, so that the connection by the wire bonding can be easily performed. Especially in this embodiment, regions connected by wire bonding including the emitter regions 13 and 23 and the base regions 12 and 22 can be provided in four directions of the semiconductor substrate 3, so that the mounting can be further easily performed.

However, in the case where the shape of each base region is different from that of this embodiment, the emitter region may have the following pattern shape. A wide region of the emitter region functioning as a main heat generating portion is formed on one side of the base region in accordance with the pattern shape of the base region, and a region for performing the wire bonding connection to the base region is ensured on the other side of the base region.

Fifthly, each of the emitter regions 13 and 23 has a wide region and a narrow region which extends toward one end of each of the base regions 12 and 22, so that active regions can be activated.

Sixthly, this embodiment realizes the minimum size in which two vertical-type bipolar transistors 1 and 2 can be disposed in an equally divided manner by the separation band 7, so that the chip size of a semiconductor device can be reduced, and active regions functioning as vertical-type bipolar transistors can be ensured as much as possible. It is appreciated that the separation band 7 may be provided around the vertical-type bipolar transistors 1 and 2, in addition to the center portion of the semiconductor substrate 3 for dividing the semiconductor substrate 3 by running across one side to the other side of the semiconductor substrate 3.

In this embodiment, in order to widely activate the active regions, it is better that the base regions 12 and 22 occupy larger portions of the semiconductor substrate 3. Thus, in accordance with the plan shape of the semiconductor substrate separated by the separation band 7, the base regions 12 and 22 are disposed while the collector regions 11 and 21 having the same conductivity type as that of the semiconductor substrate 3 are left around the base regions 12 and 22.

According to the production method of this embodiment, the first separation portion 8 and the second separation portions 9 of the separation band 7 are simultaneously formed with the impurity introduction into the base regions 12 and 22 and the emitter regions 13 and 23. Thus, no process is added to the conventional processes for individually producing vertical-type bipolar transistors, and it is possible to easily form paired two vertical-type bipolar transistors 1 and 2 at a low cost.

Accordingly, it is possible to minimize a hybrid integrated circuit utilizing the semiconductor device of this embodiment, and it is possible to reduce the number of assembling processes of the hybrid integrated circuit.

Figure 3A:
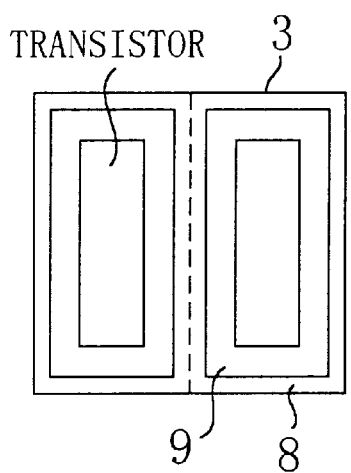
FIGS. 3(a)–3(c) are plan views for explaining a modified embodiment of a positional relationship of a first separation portion and a second separation portion in a separation band of a semiconductor device.
Figure 3B:
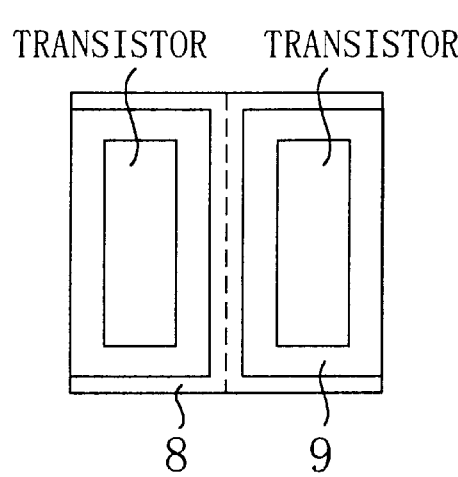
Figure 3C:
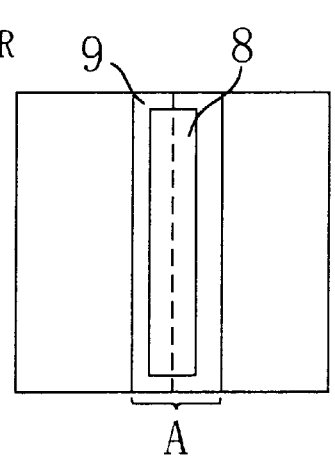

Next, modified examples of a plan construction of a first separation portion 8 and a second separation portion 9 in the separation band 7 will be described. FIGS. 3(a) to (c) are plan views for explaining the modified examples of a positional relationship between the first separation portion 8 and the second separation portion 9 in the separation band 7.

Shapes as shown in FIGS. 3(a) to (c) are considered as shapes other than the shapes of the separation band 7 in this embodiment. Herein, in order to realize good separation property between the vertical-type bipolar transistors 1 and 2, as shown in FIGS. 3(a) and (b), the first separation portion 8 preferably encloses the second separation portion 9 in the semiconductor substrate 3. On the other hand, as shown in FIG. 3(c), if the second separation portion 9 encloses the first separation portion 8, a leakage may occur in an area A.

In this embodiment, as a power transistor, a simple vertical-type bipolar transistor is used. Alternatively, if a vertical-type MOS transistor which is described later or Darlington connection power transistor is used, substantially the same effects as described above can be attained.

(SECOND EMBODIMENT)

Next, a second embodiment describes a semiconductor device including an output transistor and a temperature detecting transistor for detecting a temperature of the output transistor for preventing a thermal breakdown from occurring.

Figure 4:
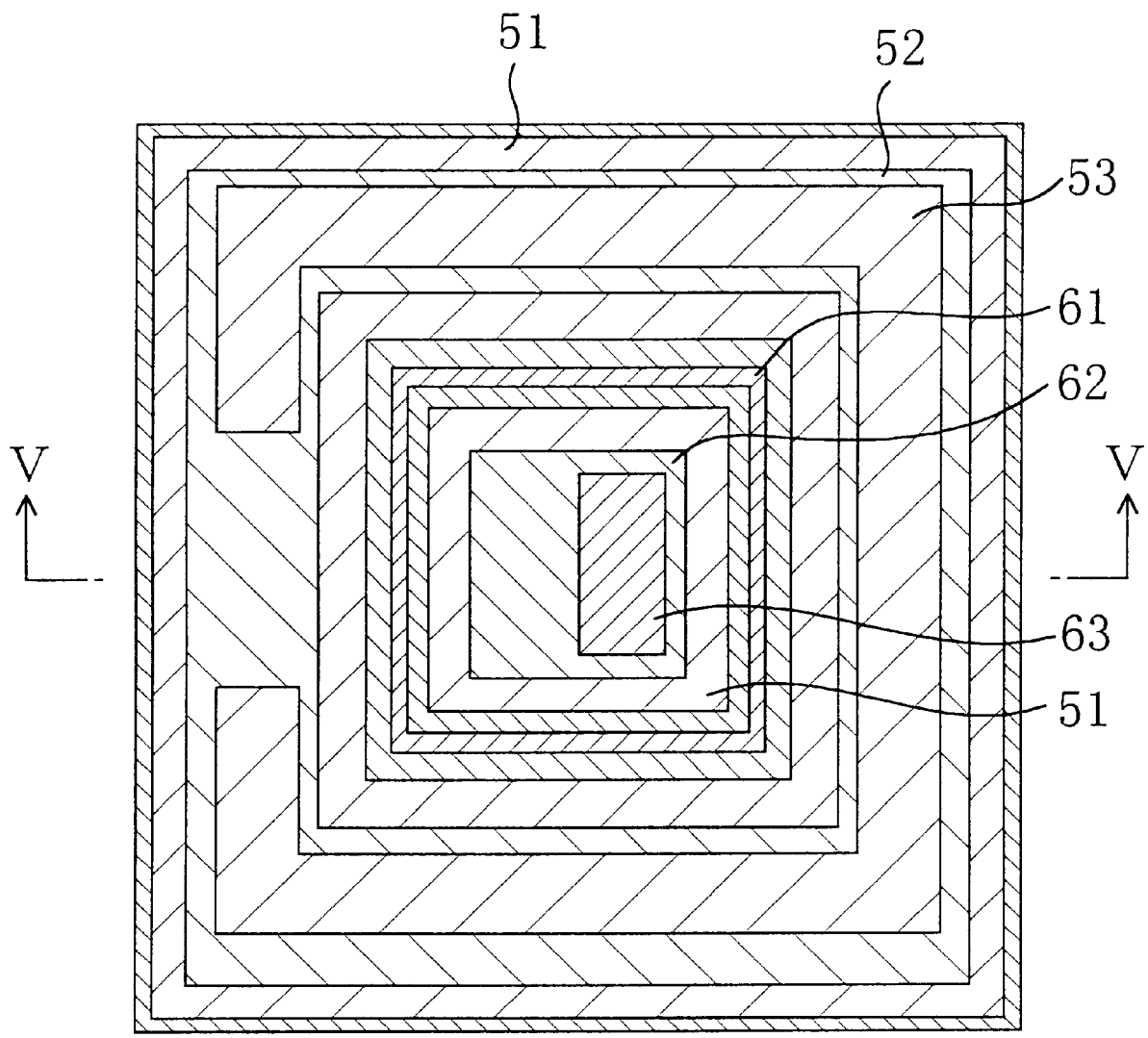
FIG. 4 is a plan view of a semiconductor device according to a second embodiment in which an output transistor and a temperature detecting transistor are disposed.
Figure 5:
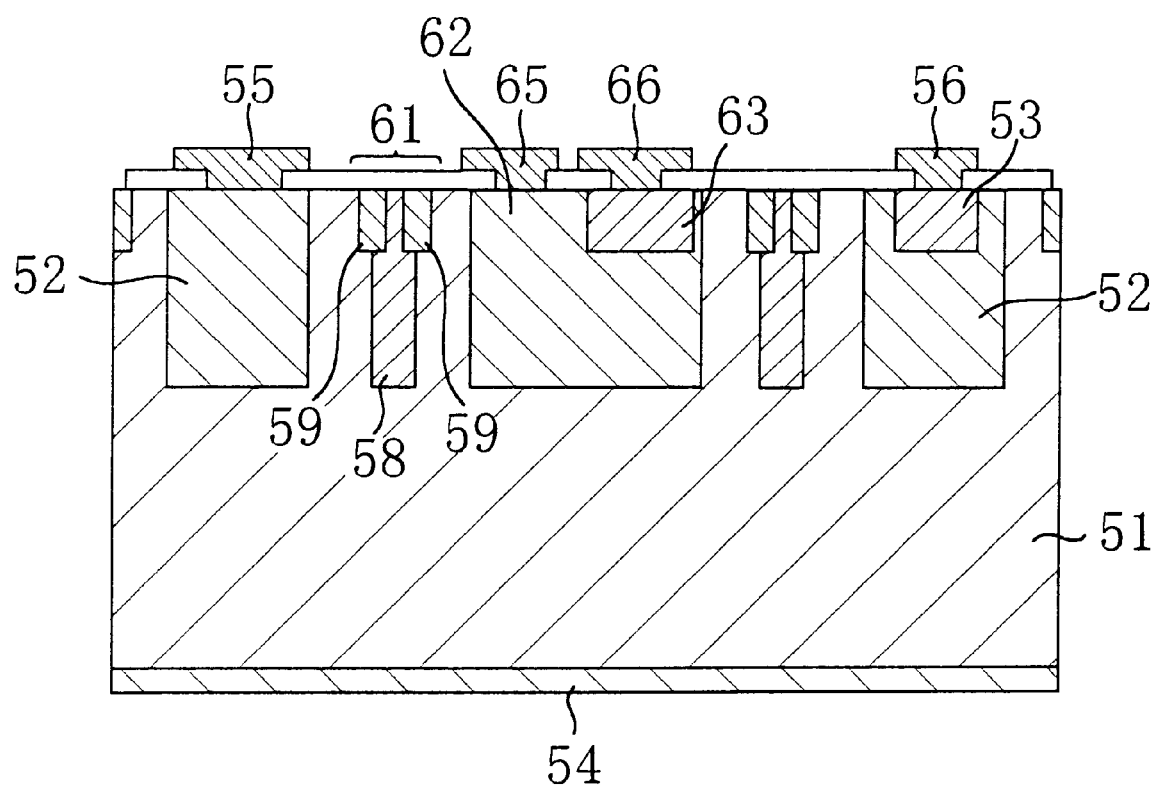
FIG. 5 is a cross-sectional view taken along a line V—V shown in FIG. 4.

FIG. 4 is a plan view of the semiconductor device according to the second embodiment, and FIG. 5 is a cross-sectional view taken along a line V—V shown in FIG. 4.

As shown in FIG. 4, the semiconductor device includes a collector region 51, a ring-shaped first base region 52, a C-shaped first emitter region 53, a separation band 61, a cubic second base region 62, and a rectangular parallelopiped second emitter region 63. The collector region 51 is an N-type silicon substrate. The first base region 52 is formed on the collector region 51. The first emitter region 53 is formed on the first base region 52. The separation band 61 is formed in the inside of the first base region 52 and the first emitter region 53 on the collector region 51. The second base region 62 is formed in the inside of the insulating band 61. The second emitter region 63 is formed on the second base region 62. The semiconductor device further includes a collector electrode 54, a first base electrode 55, a second base electrode 65, a first emitter electrode 56, and a second emitter electrode 66. The collector electrode 54 is provided on a lower face of the collector region 51. The first base electrode 55 is provided on an upper face of the first base region 52. The second base electrode 65 is provided on the second base region 62. The first emitter electrode 56 is provided on an upper face of the first emitter region 53. The second emitter electrode 66 is provided on the second emitter region 63. The collector region 51, the first base region 52, and the first emitter region 53 constitute an output transistor 50. The collector region 51, the second base region 62, and the second emitter region 63 constitute a temperature detecting transistor 60.

The separation band 61 includes a first separation portion 58 and second separation portions 59. The first separation portion 58 is doped with an impurity of the same conductivity type and the same concentration as those of the base regions 52 and 62 to substantially the same depth as that of the base regions 52 and 62. The second separation portions 59 are doped with an impurity of the same conductivity type and the same concentration as those of the emitter regions 53 and 63 to substantially the same depth as that of the emitter regions 53 and 63. In a deeper portion of the semiconductor substrate, only the first separation portion 58 exists. In the vicinity of the upper face of the 4semiconductor substrate, the second separation portions 59 are formed in boundary portions between the first separation portion 58 and the collector region 51. The two second separation portions 59 sandwich the first separation portion 58.

Next, a production method of the semiconductor device according to this embodiment will be described.

First, boron is simultaneously diffused in a selective manner onto a circular N-type silicon substrate (the collector region 51) which is doped with phosphorus. Thus, a first base region 52, a second base region 62, and a first separation portion 58 which are independent are simultaneously formed so as to have the same diffusion depth. Next, phosphorus is introduced into part of the first base region 52 and the second base region 62 which are formed in the foregoing process, so as to form a first emitter region 53 and a second emitter region 63. At the same time, phosphorus is also introduced into a region spreading across the first base region 52 and the first separation portion 58 and a region spreading across the second base region 62 and the first separation portion 58, so as to form second separation portions 59. As the result of this process, the emitter regions 53 and 63 and the second separation portions 59 which are shallower than the base regions 52 and 62 are formed.

Thereafter, after an insulating film is deposited on the substrate, a connection hole is formed through the insulating film. A metal film such as an aluminum alloy film is deposited on the substrate. The metal film is processed by patterning, so as to form a first base electrode 56 and a second base electrode 65 which are in contact with the first and second base regions 52 and 62, respectively, and a first emitter electrode 56 and a second emitter electrode 66 which are in contact with the first and second emitter regions 53 and 63, respectively.

In a final process, the circular silicon substrate is cut into semiconductor devices. Each of the semiconductor devices has an appropriate chip size and includes the output transistor 50, the temperature detecting transistor 60, and the separation band 61 for electrically separating the transistors from each other.

The semiconductor device according to this embodiment having the above-described construction can attain the following functions and effects.

First, the output transistor 50 and the temperature detecting transistor 60 are separated by the separation band 62 which includes two layers of different conductivities, so that the construction is not affected by a noise signal (noise) or the like. Thus, when a temperature of the output transistor 50 is detected by the temperature detecting transistor 60, it is possible to perform the temperature detection with higher accuracy.

Secondly, the first separation portion 58 of the separation band 61 includes the impurity of the same depth, the same conductivity type, and the same concentration as those of the base regions 52 and 62, and the second separation portion 59 includes the impurity of the same depth, the same conductivity type, and the same concentration as those of the emitter regions 53 and 63. Accordingly, the separation band 61 can be formed by utilizing the process for forming the transistors 50 and 60.

Thirdly, as described in the first embodiment, a breakdown is caused in the output transistor 50 and the temperature detecting transistor 60, when reverse voltages which are substantially equal to the withstand voltage values of the transistors 50 and 60, respectively, are applied. Thus, it is possible to maintain the separation and the withstand voltage property between the output transistor 50 and the temperature detecting transistor 60 as high as possible.

The temperature detecting transistor 60 is enclosed by the first emitter region 53 as a heat generating portion of the output transistor 50, so that the detected temperature by the temperature detecting transistor 60 is matched with the temperature of the output transistor 50. Thus, the accuracy of temperature detection is increased.

Figure 6:
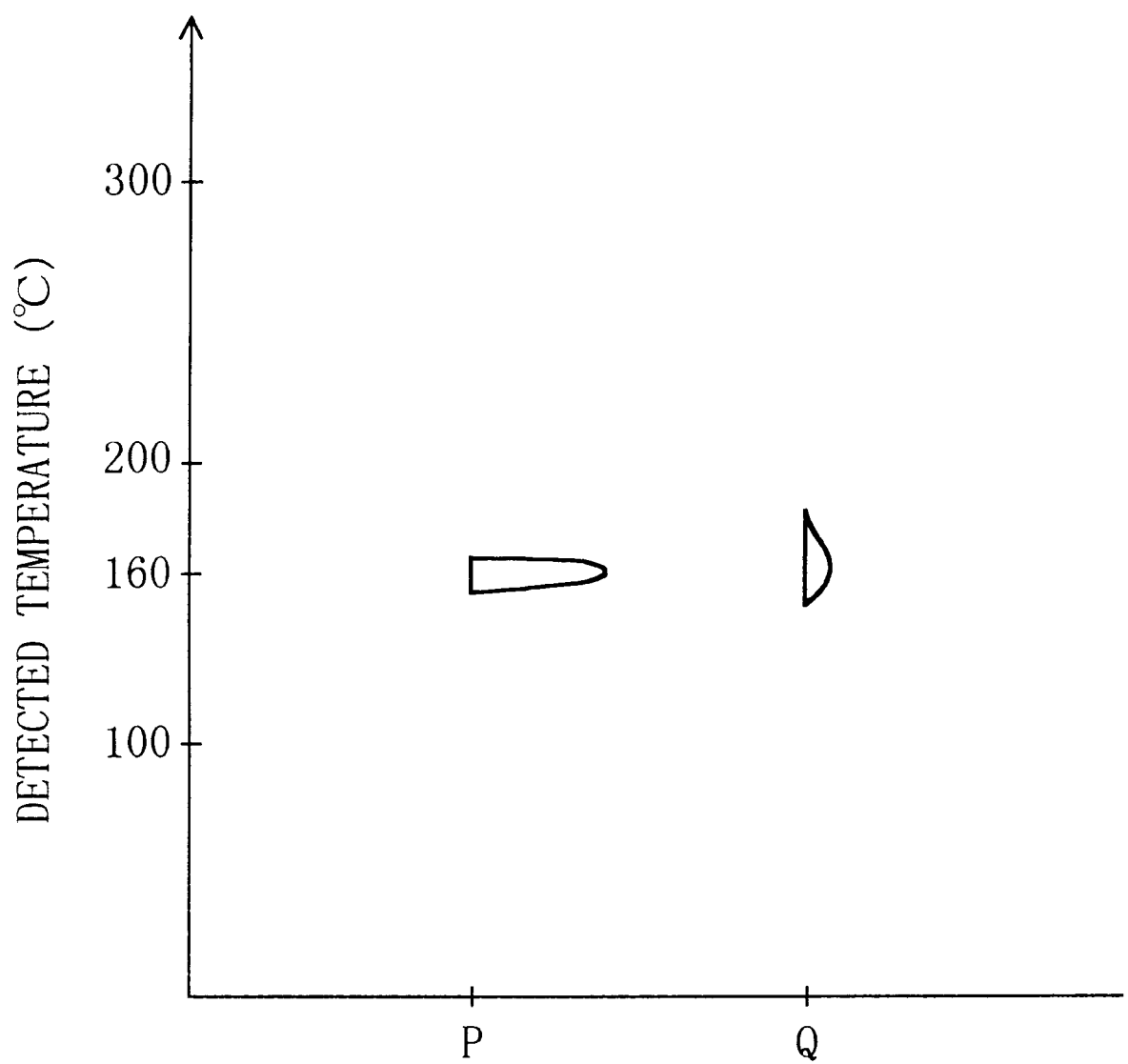
FIG. 6 is a diagram showing data of variation in detected temperatures by the semiconductor device according to the second embodiment and a conventional semiconductor device.

Next, data relating to effects of the semiconductor device of this embodiment will be described. FIG. 6 is a diagram showing data of experiments performed for comparing the variation in the detected temperatures by a conventional semiconductor device including a channel stopper region of a single conductivity-type construction enclosing each transistor, and the semiconductor device of this embodiment including an separation band for separating the transistors which is constituted by two layers of different conductivity types. The conventional semiconductor device and the semiconductor device of this embodiment are disposed in an audio apparatus, and the temperature of the output transistor is set so as to be 220 degrees Celsius.

In the figure, the letter P designates the distribution of the detected temperature by the semiconductor device of this embodiment, and the letter Q designates the distribution of the detected temperature by the conventional semiconductor device. As shown in the figure, the variation in the detected temperature by the semiconductor device of this embodiment is greatly reduced as compared with the variation in the detected temperature by the conventional semiconductor device.

Accordingly, when the semiconductor device of this embodiment is applied to an audio apparatus, the failure rate of the audio apparatus can remarkably be reduced.

In this embodiment, a single transistor construction is adopted as the output transistor. Instead of the single transistor, if a Darlington connection transistor construction is adopted, the same effects as described above can be attained.

(THIRD EMBODIMENT)

Next, a third embodiment will be described.

Figure 7:
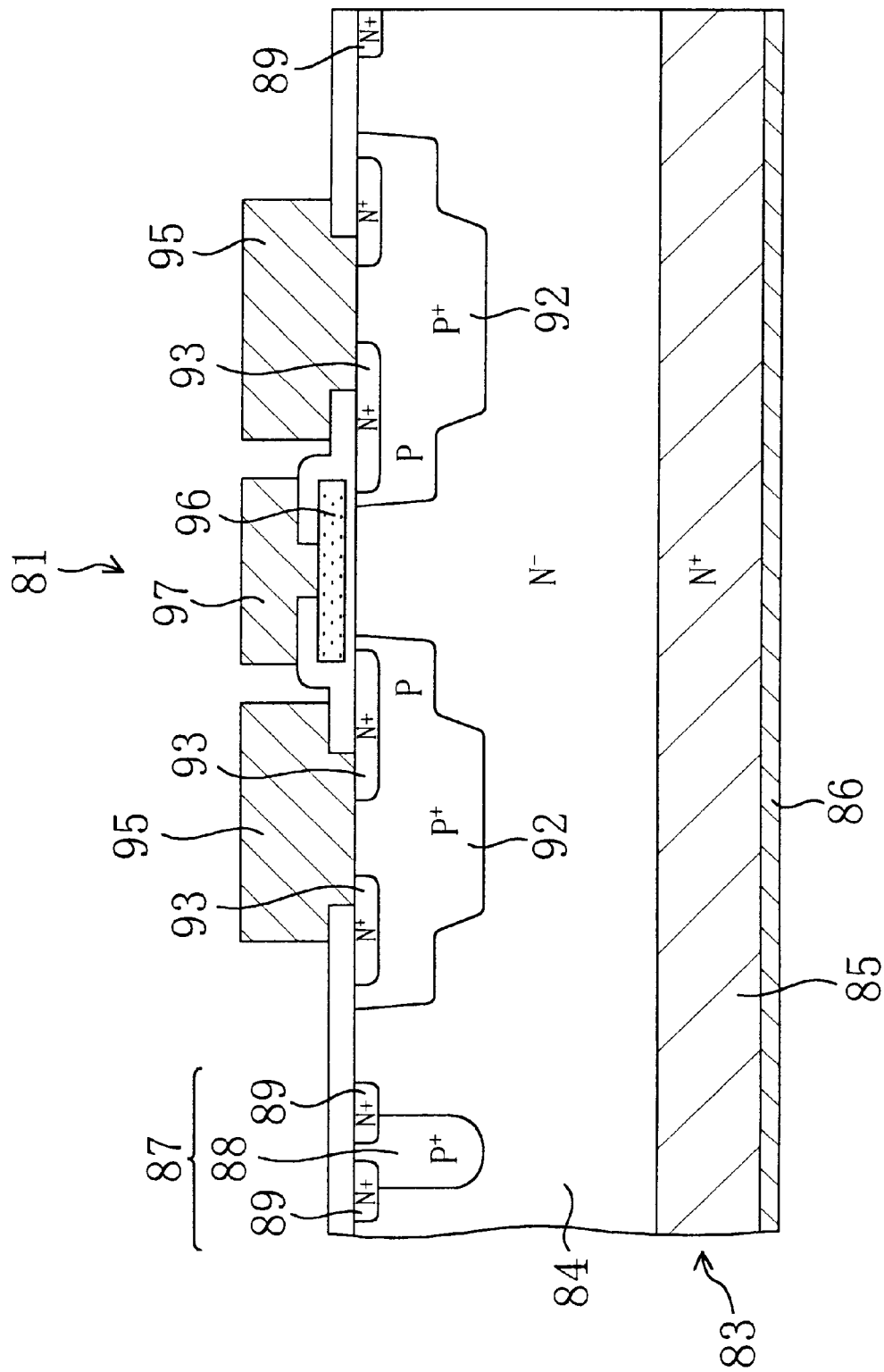
FIG. 7 is a cross-sectional view showing a construction of a power vertical-type MOSFET according to a third embodiment.

FIG. 7 is a cross-sectional view showing an example in which the invention is applied to a power MOSFET. It is understood that the left portion of the shown substrate is omitted in this figure, and any arbitrary semiconductor device can be disposed in this portion. As shown in the figure, a power vertical-type MOSFET 1 is disposed in a semiconductor substrate 83. The power vertical-type MOSFET 1 is separated from the other regions by a separation band 87. In this embodiment, the power vertical-type MOSFET 1 is constituted by two vertical-type MOSFETs. Generally, one power vertical-type MOSFET is constituted by vertical-type MOSFETs of which the number is determined in accordance with the electric power. The semiconductor substrate 83 is doped with an N-type impurity (for example, boron).

Each of the MOSFETs includes two source regions 93, a P-type well region 92, and an N-type substrate region 84 (including the impurity with which the semiconductor substrate 83 is doped). The source regions 93 are spaced from each other. The P-type well region 92 encloses the two source regions 93 in the substrate. The N-type substrate region 84 encloses the P-type well region 92 in the substrate. In addition, a drain contact region 85 including an N-type impurity of high concentration is disposed under the N-type substrate region 84. On the drain contact region 85, a drain electrode 86 is provided. On an upper face of the semiconductor substrate 83, a source electrode 95 is formed. The source electrode 95 is in contact with the P-type well region 92 and the two source regions 93. Additionally, a polysilicon gate 96 and a gate electrode 97 are provided. The polysilicon gate 96 is provided across the P-type well regions 92 of the two MOSFETs and the source region 93 of one of the MOSFETs via an insulating film. The gate electrode 97 is in contact with the polysilicon gate 96.

The separation band 87 includes a first separation portion 88 and second separation portions 89. The first separation portion 88 is provided in the vicinity of the upper face of the semiconductor substrate 83. The first separation portion 88 is doped with an impurity of the same conductivity type and substantially the same concentration as those of the P-type well region 92. The second separation portions 89 are formed on both sides of the first separation portions 88. An impurity of the same conductivity type and substantially the same concentration as those of the source regions 93 is introduced into the second separation portions 89. Although not shown in the figure, the first separation portion 88 extends from one side face of a chip (for example, in an upward direction of the sheet of FIG. 7) to the opposite other side face (for example, in a downward direction of the sheet). The second separation portions 89 surround the power vertical-type MOSFET 81. The widths of the first separation portion 88 and the second separation portion 89 are the same as those in the first embodiment.

In this embodiment, a power vertical-type MOSFET having the same construction as that of the above-described power vertical-type MOSFET 81 is disposed in the left region of FIG. 7, so as to provide a circuit in which a pair of power transistors having identical characteristics are required. Alternatively, a sensor device or a control device which is used for controlling a temperature of the power vertical-type MOSFET can be disposed in the left region of FIG. 7. In addition, as shown in FIG. 4, a power vertical-type MOSFET consisting of a number of vertical-type MOSFETs may be disposed around a temperature detecting device.

Also in this embodiment, when the cross-sectional construction and plan shapes are provided as those in the first embodiment or the second embodiment, the same effects as those in the first embodiment or the second embodiment can be attained. A heat generating portion of the power vertical-type MOSFET according to this embodiment is the source region 93 on which a current is concentrated.

(OTHER EMBODIMENTS)

Next, a plan construction in the case where the separation band construction according to the invention is provided in a semiconductor device including three or more transistors will be described.

Figure 9:
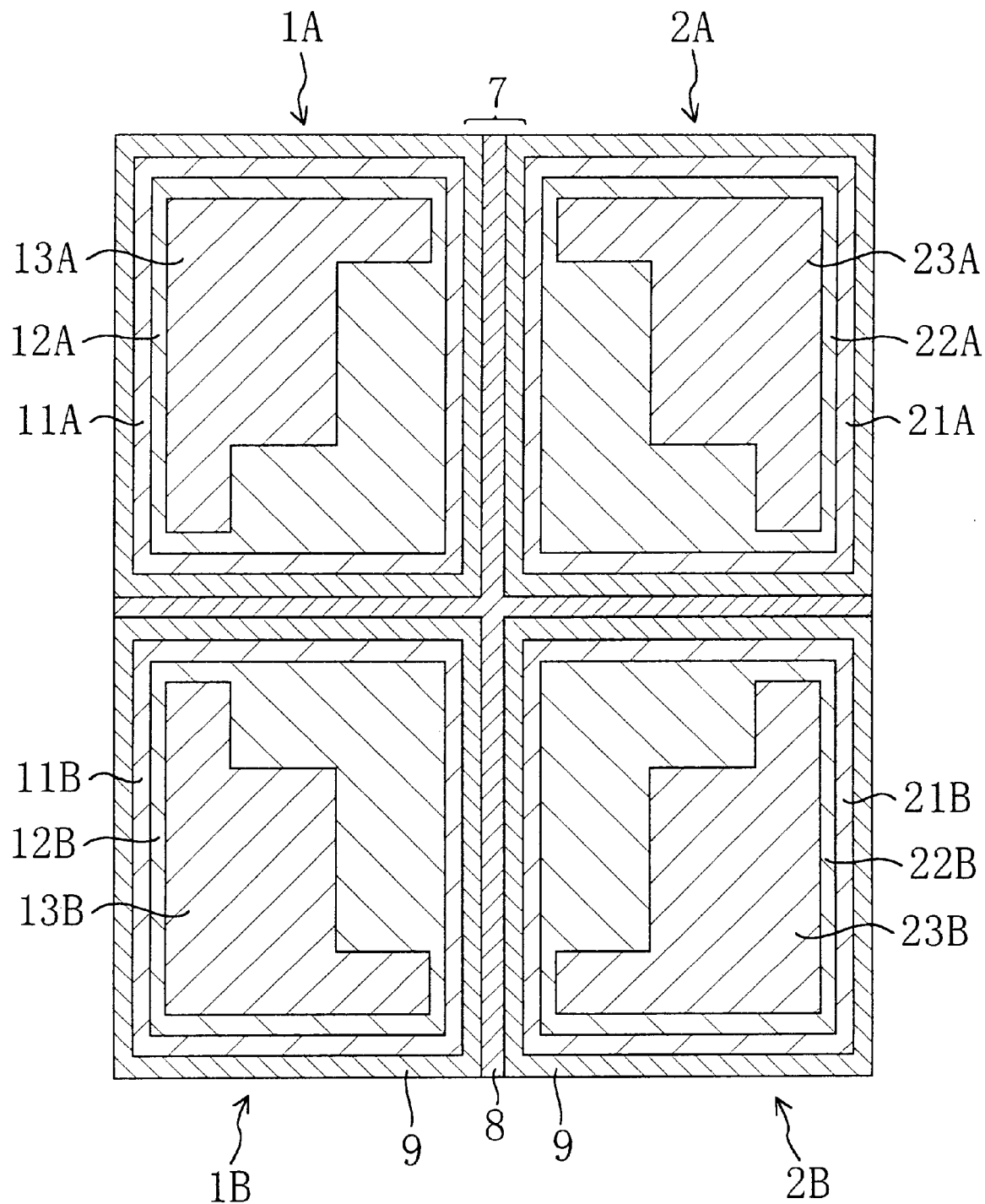
FIG. 9 is a plan view showing a positional relationship of an emitter region of a semiconductor device including four power vertical-type bipolar transistors according to another embodiment.

FIG. 9 is a plan view showing disposition of respective regions in a semiconductor device including four transistors 1A, 2A, 1B, and 2B basically having the same construction as that of a vertical-type bipolar transistor according to the first embodiment. As shown in the figure, a first separation portion 8 of a separation band 7 is formed in a cross shape so as to divide a chip into four parts. Second separation portions 9 are provided on both sides of the first separation portion 8. The respective second separation portions 9 enclose circumferences of the respective transistors 1A, 2A, 1B, and 2B. Base regions 12A, 22A, 12B, and 22B are formed in the inside of collector regions 11A, 21A, 11B, 21B of the transistors 1A, 2A, 1B, and 1B, respectively. The circumferential portions of the respective base regions 12A, 22A, 12B, and 22B are rectangular and have the same size. In the base regions 12A, 22A, 12B, and 22B, emitter regions 13A, 23A, 13B, and 23B are formed, respectively. Heat generating portions of the emitter regions 13A, 23A, 13B, and 23B are disposed in four corners, so that the heat can be prevented from concentrating.

Figure 10:
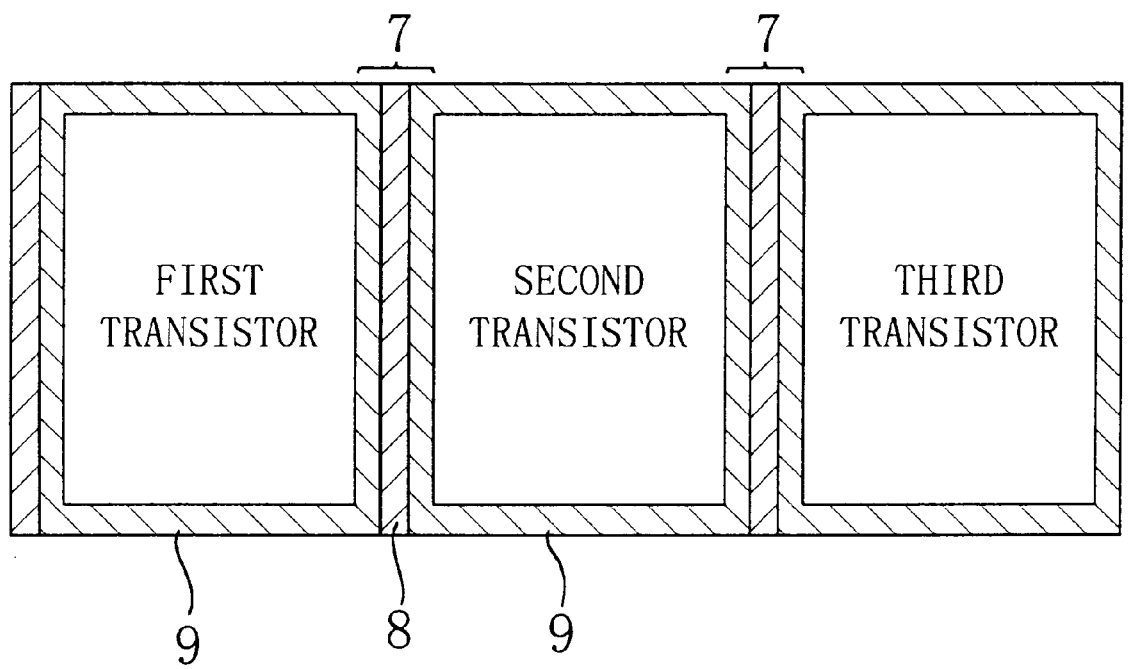
FIG. 10 is a plan view showing a construction of a separation band for separating three transistors according to another embodiment.
Figure 11:
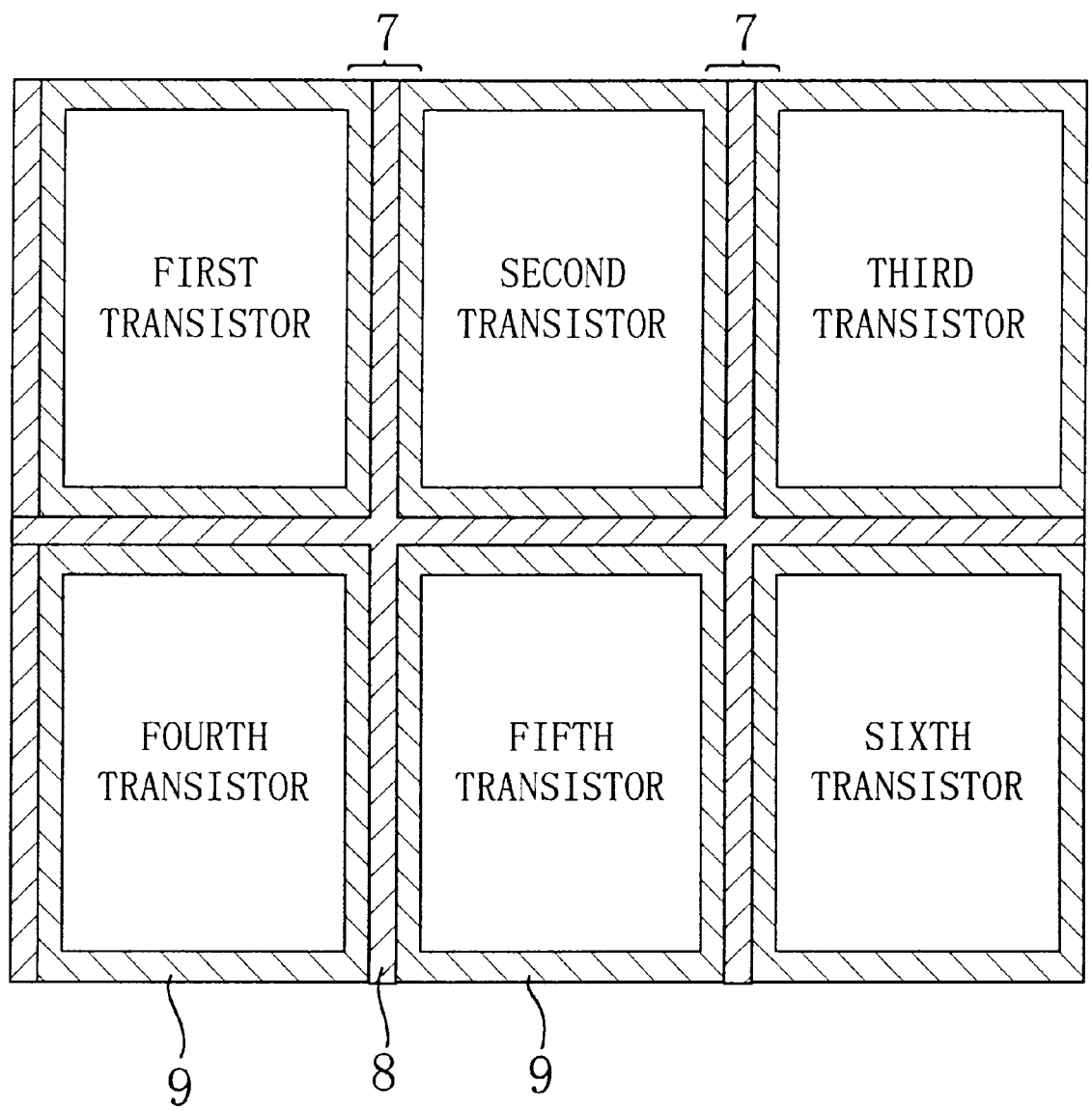
FIG. 11 is a plan view showing a construction of a separation band for separating six transistors according to another embodiment.

FIG. 10 is a plan view showing an exemplary construction of a first separation portion 8 and second separation portions 9 of a separation band 7 in the case where three power transistors, i.e., a first, a second, and a third transistors are disposed. FIG. 11 is a plan view showing an exemplary construction of a first separation portion 8 and second separation portions 9 of a separation band 7 in the case where six power transistors, i.e., a first to a sixth transistors are disposed. In such cases, the electrical separation between respective transistors can be ensured while three or six power transistors having identical electrical characteristics are disposed in one common semiconductor substrate.

What is claimed is:

1. A semiconductor device comprising:

a semiconductor substrate;

two semiconductor devices formed in part of said semiconductor substrate;

a first semiconductor region of a first conductivity type for electrically separating said two semiconductor devices; and two second semiconductor regions of a second conductivity type for separating said two semiconductor devices, at least one portion of each of said second semiconductor regions being formed on both sides of said first semiconductor region, wherein:

each of said semiconductor devices is a power vertical-type bipolar transistor including: an emitter region of said second conductivity type formed directly under an upper face of said semiconductor substrate; a base region of said first conductivity type formed by enclosing said emitter region in said semiconductor substrate; and a collector region of said second conductivity type formed by enclosing said base region in said semiconductor substrate, and each of said second semiconductor regions has an impurity concentration and a diffusion depth which are substantially equal to those of said emitter region.

2. A semiconductor device comprising:

a semiconductor substrate;

two semiconductor devices formed in part of said semiconductor substrate;

a first semiconductor region of a first conductivity type for electrically separating said two semiconductor devices; and two second semiconductor regions of a second conductivity type for separating said two semiconductor devices, at least one portion of each of said second semiconductor regions being formed on both sides of said first semiconductor region, wherein:

each of said semiconductor devices is a vertical-type bipolar transistor including: an emitter region of said second conductivity type formed directly under an upper face of said semiconductor substrate; a base region of said first conductivity type formed by enclosing said emitter region in said semiconductor substrate; and a collector region of said second conductivity type formed by enclosing said base region in said semiconductor substrate, and horizontal distances between each of said second semiconductor regions and each of base regions of each semiconductor device which is opposite to said each of said second semiconductor regions by sandwiching said collector region of said each of said semiconductor device on both sides of an area formed by said first and second semiconductor regions are substantially equal to each other.

3. A semiconductor device comprising:

a semiconductor substrate;

two semiconductor devices formed in part of said semiconductor substrate;

a first semiconductor region of a first conductivity type for electrically separating said two semiconductor devices; and two second semiconductor regions of a second conductivity type for separating said two semiconductor devices, at least one portion of each of said second semiconductor regions being formed on both sides of said first semiconductor region, wherein:

each of said semiconductor devices is a power MOSFET including: a source region of said second conductivity type formed directly under an upper face of said semiconductor substrate; a well region of said first conductivity type formed adjacently to said source region directly under the upper face of said semiconductor substrate; a substrate region of said second conductivity type formed by enclosing said well region in said substrate, said substrate region reaching a lower face of said semiconductor substrate; a channel region of said first conductivity type interposed between said source region and said substrate region in the vicinity of the upper face of said semiconductor substrate; and a gate disposed over said source region, said channel region and said substrate region via an insulating film, and said first semiconductor region has a diffusion depth and an impurity concentration which are equal to or more than those of said well region.

4. A semiconductor device comprising:

a semiconductor substrate;

two semiconductor devices formed in part of said semiconductor substrate;

a first semiconductor region of a first conductivity type for electrically separating said two semiconductor devices; and two second semiconductor regions of a second conductivity type for separating said two semiconductor devices, at least one portion of each of said second semiconductor regions being formed on both sides of said first semiconductor region, wherein:

each of said semiconductor devices is a power MOSFET including: a source region of said second conductivity type formed directly under an upper face of said semiconductor substrate; a well region of said first conductivity type formed adjacently to said source region directly under the upper face of said semiconductor substrate; a substrate region of said second conductivity type formed by enclosing said well region in said substrate, said substrate region reaching a lower face of said semiconductor substrate; a channel region of said first conductivity type interposed between said source region and said substrate region in the vicinity of the upper face of said semiconductor substrate; and a gate disposed over said source region, said channel region and said substrate region via an insulating film, and each of said second semiconductor regions has an impurity concentration and a diffusion depth which are substantially equal to those of said source region.

5. A semiconductor device comprising:

a semiconductor substrate;

two semiconductor devices formed in part of said semiconductor substrate;

a first semiconductor region of a first conductivity type for electrically separating said two semiconductor devices; and two second semiconductor regions of a second conductivity type for separating said two semiconductor devices, at least one portion of each of said second semiconductor regions being formed on both sides of said first semiconductor region, wherein:

one of said two semiconductor devices is a power transistor, and the other one of said two semiconductor devices is selected from a sensor device and a control device attached to said power transistor, wherein:

said one of said semiconductor devices is a vertical-type device, and at least one semiconductor region of said first semiconductor region and said second semiconductor regions has a diffusion depth which is substantially equal to that of a diffusion region of said one of said semiconductor devices, and wherein:

each of said semiconductor devices is a vertical-type bipolar transistor including:

an emitter region of said second conductivity type formed directly under the upper face of said semiconductor substrate; a base region of said first conductivity type formed by enclosing said emitter region in said semiconductor substrate; and a collector region of said second conductivity type formed by enclosing said base region in said semiconductor substrate, said other one of said semiconductor devices is a temperature detecting device, said emitter region of said bipolar transistor is disposed around said other one of said semiconductor devices, and said collector regions of said semiconductor devices are provided in common under said first and second semiconductor regions.

6. The semiconductor device of claim 5, wherein said each of said second semiconductor regions enclose a circumference of said other one of said semiconductor devices.

7. A semiconductor device comprising:

a semiconductor substrate having a chip shape;

two power semiconductor devices provided in said semiconductor substrate, said power semiconductor devices having substantially identical electric characteristics, and part of each of said power semiconductor devices functioning as a heat generating portion; and a separation band for electrically separating said semiconductor devices, wherein said heat generating portions of said two semiconductor devices are disposed in opposite corners of said chip shape.

8. The semiconductor device of claim 7, wherein each of said semiconductor devices is a power vertical-type bipolar transistor, and said bipolar transistors include a common collector region, and base regions and emitter regions are separated by said separation band.

9. A semiconductor device comprising:

a semiconductor substrate having a chip shape and having four corners;

four power semiconductor devices provided in four regions including at least one corner of said semiconductor substrate, said power semiconductor devices having substantially identical electric characteristics, and part of each of said power semiconductor devices functioning as a heat generating portion; and a separation band for electrically separating said four semiconductor devices, wherein said heat generating portions of said semiconductor devices are disposed in said four corners, respectively.

10. The semiconductor device of claim 9, wherein:

each of said semiconductor devices is a power vertical-type bipolar transistor, and said bipolar transistors include a common collector region, and base regions and emitter regions are separated by said separation band.

11. A semiconductor device comprising:

a semiconductor substrate having a chip shape;

two power semiconductor devices provided in said semiconductor substrate, said power semiconductor devices having substantially identical electric characteristics, and part of each of said power semiconductor devices functioning as a heat generating portion; and a separation band for electrically separating said two semiconductor devices, wherein part of said heat generating portion of each of said semiconductor devices is close to said separation band, and another part of said heat generating portion is farther from said separation band, and relative positions of said two heat generating portions are determined so that a portion of said separation band which is close to said two heat generating portions is minimum.

12. The semiconductor device of claim 11, wherein each of said semiconductor devices is a power vertical-type bipolar transistor, a base region of said bipolar transistor is formed along a shape in which said semiconductor substrate is divided by said separation band, an emitter region of said bipolar transistor is formed in said base region, and said heat generating portion is determined by a shape of said emitter region of said bipolar transistor.

13. The semiconductor device of claim 12, wherein circumferential portions of said base regions of said respective semiconductor devices are symmetric with respect to said separation band as a line in plan, and said emitter regions of said respective semiconductor devices are symmetric with respect to a center portion of said separation band as a point in plan.

14. A semiconductor device comprising:

a semiconductor substrate;

two semiconductor devices formed in part of said semiconductor substrate;

a first semiconductor region of a first conductivity type for electrically separating said two semiconductor devices; and two second semiconductor regions of a second conductivity tape for separating said two semiconductor devices, at least one portion of each of said second semiconductor regions being formed on both sides of said first semiconductor region, wherein:

each of said two semiconductor devices is a vertical-type bipolar transistor including: an emitter region of said second conductivity type formed on said substrate region; a base region of said first conductivity type formed by enclosing said emitter region on said semiconductor substrate; respective said emitter regions being formed separately from each other; and respective said base regions formed separately from each other, and said substrate region a common collector region shared by said two semiconductor devices.

15. The semiconductor device of claim 14, wherein each of said second semiconductor regions are formed so as to be shallower than said first semiconductor region and opposite to said base region of each of said two semiconductor devices on both sides of said substrate region.

16. A semiconductor device comprising:

a semiconductor substrate;

two semiconductor devices formed in part of said semiconductor substrate;

a first semiconductor region of a first conductivity type for electrically separating said two semiconductor devices; and two second semiconductor regions of a second conductivity type for separating said two semiconductor devices, at least one portion of each of said second semiconductor regions being formed on both sides of said first semiconductor region, wherein:

each of said two semiconductor devices is a power MOSFET including: a source region of said second conductivity type formed on said substrate region, respective said source regions being formed separately from each other; and a well region of said first conductivity type formed adjacently to said source region on said substrate region; a channel region of said first conductivity type interposed between said source region and said substrate region; and a gate disposed over said source region, said channel region and said substrate region via an insulating film, and said substrate region is a common drain region shared by said two semiconductor devices.

17. The semiconductor device of claim 16, wherein each of said second semiconductor regions is formed so as to be shallower than said first semiconductor region and opposite to said channel region of each of said two semiconductor devices on both sides of said substrate region.

* * * * *